(12) United States Patent
Lee et al.

(10) Patent No.: US 8,053,158 B2
(45) Date of Patent: Nov. 8, 2011

(54) PHOTOSENSITIVE COMPOSITIONS USEFUL FOR FORMING ACTIVE PATTERNS, METHODS OF FORMING SUCH ACTIVE PATTERNS AND ORGANIC MEMORY DEVICES INCORPORATING SUCH ACTIVE PATTERNS

(75) Inventors: Sang Kyun Lee, Seongnam-si (KR); Won Jae Joo, Hwaseong-si (KR); Kwang Hee Lee, Suwon-si (KR); Tae Lim Choi, Seongnam-si (KR); Myung Sup Jung, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 706 days.

(21) Appl. No.: 11/655,171

(22) Filed: Jan. 19, 2007

(65) Prior Publication Data

US 2007/0202436 A1 Aug. 30, 2007

(30) Foreign Application Priority Data

Jan. 19, 2006 (KR) .................. 10-2006-0005828
Jan. 17, 2007 (KR) .................. 10-2007-0005362

(51) Int. Cl.
*G03F 7/004* (2006.01)
(52) U.S. Cl. ............... 430/170; 430/270.1; 430/921
(58) Field of Classification Search .......... 430/170, 430/270.1, 921
See application file for complete search history.

(56) References Cited

U.S. PATENT DOCUMENTS

| 5,436,092 A | * | 7/1995 | Ohtsuka et al. | 429/218.1 |
| 5,558,971 A | * | 9/1996 | Urano et al. | 430/170 |
| 6,638,680 B2 | * | 10/2003 | Lamotte et al. | 430/160 |
| 6,689,530 B2 | * | 2/2004 | Ohsawa et al. | 430/170 |
| 6,919,158 B2 | * | 7/2005 | Kawamura et al. | 430/270.1 |
| 6,949,329 B2 | * | 9/2005 | Endo et al. | 430/322 |
| 7,488,569 B2 | * | 2/2009 | Kozawa et al. | 430/311 |
| 2001/0018162 A1 | * | 8/2001 | Hatakeyama et al. | 430/270.1 |
| 2003/0044717 A1 | * | 3/2003 | Kodama | 430/270.1 |
| 2005/0277055 A1 | * | 12/2005 | Kon | 430/270.1 |

* cited by examiner

*Primary Examiner* — John Chu
(74) *Attorney, Agent, or Firm* — Harness, Dickey & Pierce, P.L.C.

(57) ABSTRACT

Disclosed herein are compositions useful in forming organic active patterns that may, in turn, be incorporated in organic memory devices. The compositions comprise N-containing conjugated electroconductive polymer(s), photoacid generator(s) and organic solvent(s) capable of dissolving suitable quantifies of both the electroconductive polymer and the photoacid generator. Also disclosed are methods for patterning organic active layers formed using one or more of the compositions to produce organic active patterns, portions of which may be arranged between opposed electrodes to provide organic memory cells. The methods include directly exposing and developing the organic active layer to obtain fine patterns without the use of a separate masking pattern, for example, a photoresist pattern, thereby tending to simplify the fabrication process and reduce the associated costs.

8 Claims, 6 Drawing Sheets

Unexposed region    Exposed region

US 8,053,158 B2

PHOTOSENSITIVE COMPOSITIONS USEFUL FOR FORMING ACTIVE PATTERNS, METHODS OF FORMING SUCH ACTIVE PATTERNS AND ORGANIC MEMORY DEVICES INCORPORATING SUCH ACTIVE PATTERNS

PRIORITY STATEMENT

This non-provisional application claims priority under U.S.C. §119(a) from Korean Patent Application No. 2006-0005828, which was filed on Jan. 19, 2006 and Korean Patent Application No. 2007-5362, which was filed on Jan. 17, 2007, in the Korean Patent Office and which are incorporated herein, in their entireties, by reference.

BACKGROUND OF THE DISCLOSURE

1. Field of Endeavor

Example embodiments include compositions useful in forming patterns from active layers during fabrication of memory devices, methods of forming active patterns using such compositions, and organic semiconductor devices incorporating such active patterns. More particularly, example embodiments include compositions which are based on one or more N-containing conjugated electroconductive polymers and at least one photoacid generator that can be patterned without using a separate photoresist pattern, methods of forming such patterns using such compositions, and organic memory devices comprising such an active pattern.

2. Description of the Related Art

With the recent impressive advances in the information and communication industry, demand for various types of solid state memory devices have been increasing. Particularly, portable terminals, versatile smart cards, electronic money, digital cameras, gaming devices, and MP3 players require non-volatile memory devices, e.g., memory devices capable of retaining data once the power is switched off. Prevalent among non-volatile memories are flash memories that are based on silicon materials.

Conventional flash memories are restricted in the number of times that they can be erased and re-programmed, and tend to have relatively slow recording rates. Further, the memory capacity of such devices in predicated on large scale integration which requires the formation of increasingly fine structures, giving rise to increased production costs and/or complicated processing. Additionally, conventional flash memories are approaching limits beyond which further miniaturization of the device structures will reach physical and/or technical limitations.

As conventional flash memory devices reach these technical limitations, ongoing research and development efforts have been directed to the identification, development and/or refinement of next-generation non-volatile memories. These next-generation non-volatile memories are expected to provide advantages over the conventional flash memory devices including, for example, increased speed, reduced power consumption, increased capacity and/or reduced cost.

Depending on the material constituting the cell, next-generation memories receiving particular attention include those that may be classified as ferroelectric RAM, magnetic RAM, phase change RAM, nanotube memory, holographic memory and organic memory. Of these devices, the organic memory devices, which feature the use of an organic material formed between two electrodes with a voltage applied thereto, operate on the principle of electrical bistability, a phenomenon in which a material exhibits two distinct states of conductivity at the same applied voltage that can be utilized to form a memory cell. That is, the organic memory devices include memory cells that are capable of supporting the reading and writing of data values corresponding to a "0" and a "1" by altering the resistance of the organic material between the two electrodes in response to electrical signals of sufficient polarity and magnitude. As a result of these properties, organic memory devices are expected to overcome certain of the problems associated with conventional flash memories and exhibit, for example, improved processability, reduced production costs and/or increased degrees of integration while still maintaining the non-volatility memory characteristics.

An organic memory cell, as illustrated in FIG. 1, typically comprises a lower electrode 10 and an upper electrode 30 with an organic active layer 20 interposed therebetween. Typically, a memory device includes a large array of such memory cells and certain peripheral circuitry for selectively addressing certain of the memory cells for writing data to and reading data from the accessed memory cells. In order to form such memory cell arrays, the organic active layer and the layers of electrode material need be patterned to define the individual memory cells.

Most conventional patterning methods employ heat or an e-beam for depositing a shadow mask even when the active layer consists of monomers, or comprise selective exposure/etching steps utilizing a separately formed photoresist pattern to form an active pattern. For example, a layer of an electroconductive material is formed across the surface of a substrate to form a lower electrode. This layer of electroconductive material is then coated with a photoresist composition containing an organic active material, portions of the photoresist composition are exposed to form an exposed photoresist layer. The exposed photoresist layer is then developed to remove portions of the photoresist layer, thereby forming a photoresist pattern that can, in turn, be used as an etch mask for removing exposed portions of the organic active layer and the electroconductive layer to form an active pattern. These conventional photoresist techniques, however, are relatively complicated and tend to increase the production costs due, in part, to the use of expensive apparatus.

Conventional conjugated polymers are typically patterned using, for example, soft lithography or ink jetting, but such techniques are not generally suited for production of highly integrated memory devices. Soft lithography takes advantage of a mechanism in which the active layer is cured with heat or light, but the range of materials that can be used in such a process is relatively limited. Ink jet technologies as well tend to be generally suitable for less demanding device pattern requirements, by have proven generally unsuitable for forming patterns having critical dimensions (CD) below a microns using currently available technology. Additional difficulties with conventional ink jet technologies have been associated with the selection of proper solvents and the ability to control and maintain concentrations to a degree sufficient to maintain the desired feature sizing.

SUMMARY OF EXAMPLE EMBODIMENTS

Therefore, example embodiments are provided with respect to organic materials, methods of forming patterns from such materials and devices incorporating such patterns are provided for addressing and improving upon and/or overcoming certain of the problems associated with conventional materials, methods and devices. In particular, example embodiments are provided of materials and processes suitable for forming organic active patterns without using separate photoresist patterns during fabrication of such devices.

Example embodiments include compositions comprising: (a) an N-containing conjugated electroconductive polymer; (b) a photoacid generator; and (c) a solvent capable of dissolving both the electroconductive polymer and the photoacid generator. Example embodiments of such electroconductive polymers include, for example, aniline-based polymers and copolymers, pyrrole-based polymers and copolymers, and vinylpyridine-based polymers and copolymers. Example embodiments of the photoacid generators include, for example, onium salts and non-onium compounds.

Example embodiments include methods of forming organic active patterns during fabrication of organic memory devices including a region of the organic material interposed between a lower electrode and an upper electrode, comprising: forming an active layer by applying a composition including (a) an N-containing conjugated electroconductive polymer; (b) a photoacid generator, and (c) a solvent capable of dissolving both the electroconductive polymer and the photoacid generator to a substrate and removing a majority of the solvent; exposing selected regions of the active layer by light exposure and then developing the exposed layer to obtain an organic active pattern. Example embodiments also include organic memory devices incorporating such an organic active pattern and methods of fabricating such devices that utilize a composition and a method according to example embodiments.

BRIEF DESCRIPTION OF THE DRAWINGS

Example embodiments of the organic semiconductor materials, organic semiconductor layers formed from such materials, organic semiconductor devices incorporating such organic semiconductor layers and the performance of such organic semiconductor devices are addressed more fully below with reference to the attached drawings in which.

Figure 1:
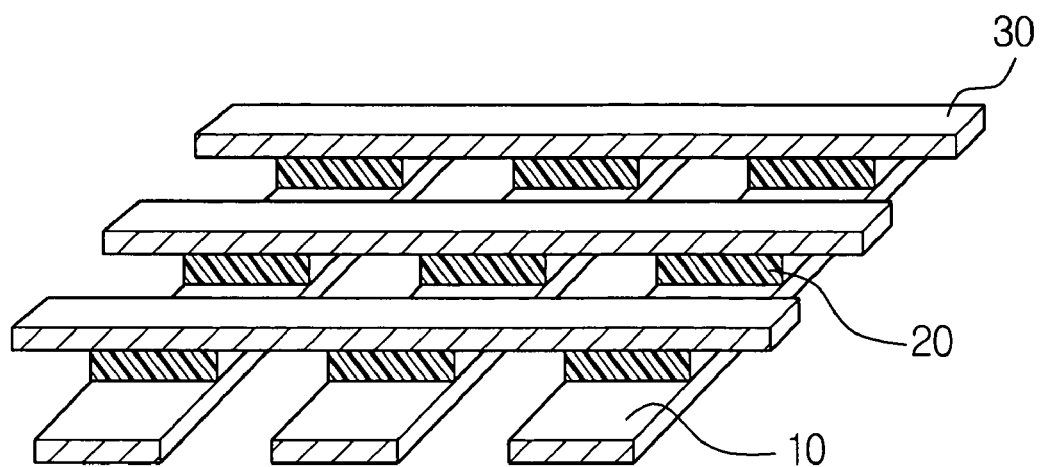
FIG. 1 is a schematic perspective view of a general memory cell array.

It should be noted that these Figures are intended to illustrate the general characteristics of memory structures according to example embodiments in order to supplement the written description provided below. These drawings, however, are not necessarily to scale and may not precisely reflect the characteristics of any particular embodiment, and should not be interpreted as defining or limiting the range of values or properties of embodiments within the scope of the disclosure. In particular, the relative positioning and sizing of atoms, bonds, layers, regions and/or device structures may be reduced, exaggerated or otherwise modified for clarity.

DESCRIPTION OF EXAMPLE EMBODIMENTS

Example embodiments include compositions useful for forming electroconductive patterns for organic memory devices, which comprise (a) a N-containing conjugated electroconductive polymer; (b) at least one photoacid generator, and (c) at least one organic solvent or solvent system capable of dissolving both the electroconductive polymer and the photoacid generator.

In those portions of the composition exposed to UV beams, the photoacid generator generates acid that will interact with the electroconductive polymer within the composition for forming patterns from the active layer material. The electroconductive polymer in those portions of the composition coating exposed to UV light will undergo a change in chemical structure that will, in turn, modify the solubility of the exposed portions relative to the unexposed portions. This difference in solubility between exposed and unexposed regions of the electroconductive polymer is utilized to form a pattern from the exposed layer by removing the more soluble portions. For example, when the polymer compound in the exposed portion is changed from a generally water-insoluble form into a water-soluble form, as shown in Reactions II and II, the water soluble region may then be removed by developing the pattern using water to leave a residual pattern of the generally water-insoluble portions.

Reaction I

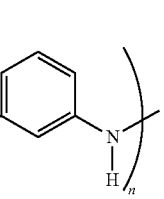

Water-insoluble form

\+ Photoacid generator $\xrightarrow{h\nu}$

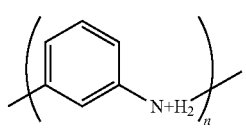

Water-soluble form

-continued

Reaction II

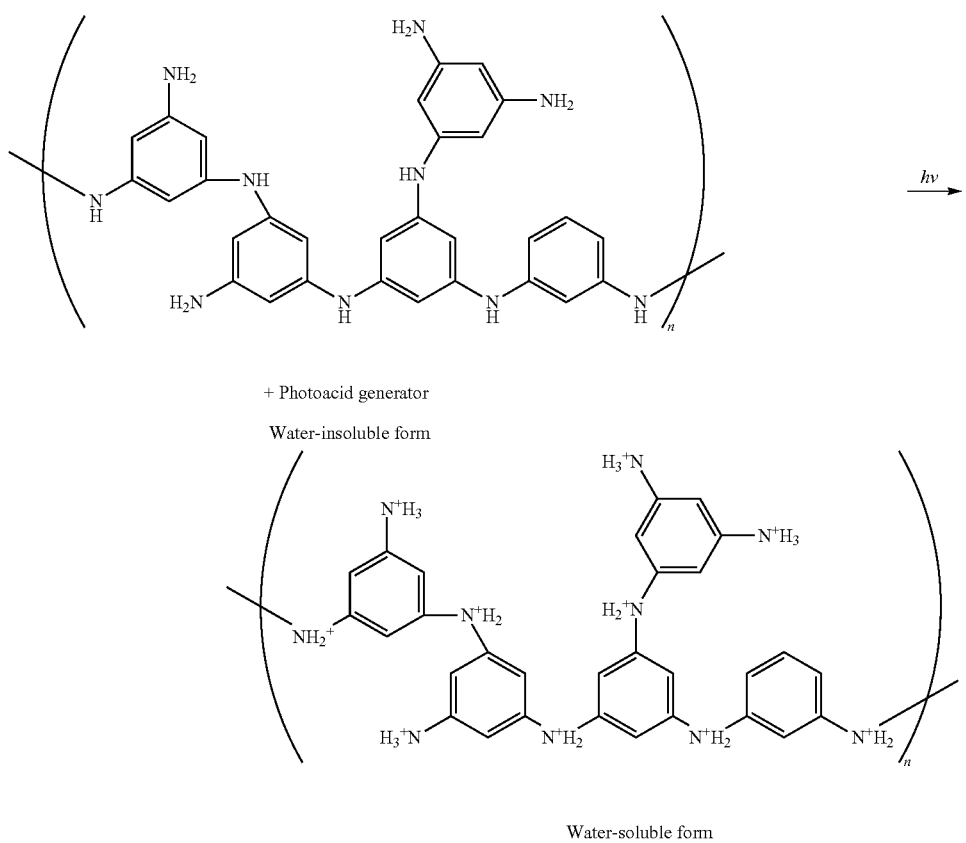

+ Photoacid generator

Water-insoluble form

Water-soluble form

Example embodiments of compounds useful in formulating such compositions includes, for example, conjugated electroconductive polymers having one or more amine groups. Such conjugated electroconductive polymers having an amine group include, for example, aniline polymers and copolymers, pyrrole polymers and copolymers, and vinylpyridine polymers and copolymers, and mixtures thereof. As used herein, the term polymer refers to those polymeric compounds formed primarily from a single monomer while the term copolymer refers to those polymeric compounds formed using at least two distinct monomers. Further as used herein, the term "conjugated" encompasses both a first group of polymeric compounds characterized by alternating single and double bonds between adjacent carbon atoms (and possibly nitrogen atoms in the case of heterogeneous ring compounds) forming the polymer backbone including, for example, polymers formed using aniline, pyrrole or vinylpyridine monomers, as well as a second group of polymeric compounds characterized both by alternating single and double bonds between adjacent carbon atoms (and, as noted above, possibly nitrogen atoms) and by amine groups arranged between adjacent monomers, with the ring compound atoms and the nitrogen atoms of the amine groups cooperating to form the polymer backbone as illustrated, for example, in Formula V, infra. Indeed, without being bound by theory, it is anticipated that many, if not all, conjugated electroconductive polymers having a number of amine groups corresponding to the size of the polymer will exhibit sufficient solubility and may, accordingly, used in formulating example embodiments of compositions.

Example embodiments of photoacid generators (PAG) suitable for use in formulating example embodiments of the compositions include both onium salts, non-onium salts and may be used singly or in combinations and mixtures. The photoacid generator(s) content of the compositions may comprise from 0.1 to 10 parts by weight based on 100 parts by weight of the total solid content, including the PAG(s), in the composition. Example embodiments of non-onium photoacid generators include, for example, compounds corresponding to Formulas I to III.

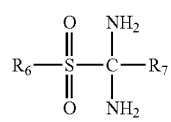

Formula I wherein, $R_6$ and $R_7$ are independently selected from a group consisting of C1-C10 straight and branched alkyl groups and C3-C10 cycloalkyl groups.

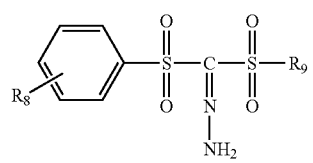

Formula II wherein, $R_8$ is selected from a group consisting of hydrogen, halogens, C1-C5 straight and branched alkyl roups, C1-C5 straight and branched alkoby and C1-C5 straight and branched haloalkyl groups; and $R_9$ is selected from a group consisting of C1-C10 branched and cyclic alkyl groups, C1-C10 alkylphenyl groups and C1-C10 haloalkyl groups.

Formula III

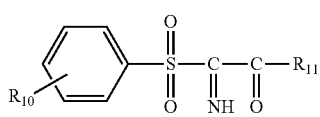

wherein $R_{10}$ is selected from a group consisting of hydrogen, halogens, C1-C5 straight and branched alkyl groups and a trifluoromethyl group; and further wherein $R_{11}$ is selected from a group consisting of C1-C10 straight, branched and cyclic alkyl groups, C1-C10 alkylphenyl groups and C1-C10 haloalkyl groups, C7-C10 phenylalkyl groups, C1-C5 straight and branched alkoxy groups, a phenyl group and a tolyl group.

Example embodiments of photoacid generators corresponding to Formula I include 1-cyclohexylsulfonyl-1-(1,1-dimethylethylsulfonyl)diasomethane, bis(cyclohexylsulfonyl) diazomethane, 1-cyclohexylsulfonyl-1-cyclohexylcarbonyl diazomethane, 1-diazo-1-cyclohexylsulfonyl-3,3'-dimethylbutan-2-one, 1-diazo-1-methylsulfonyl4-phenylbutan-2-one, diazo-1-(1,1-dimethylethylsulfonyl)3,3-dimethyl-2-butanone, and 1-acetyl-1-(1-methylethylsulfonyl)diazomethane. Example embodiments of photoacid generators corresponding to Formula II include bis(p-toluenesulfonyl)diazomethane, methylsulfonyl-p -toluenesulfonyldiazomethane, 1-diazo-1-(p-toluenesulfonyl)-3,3'-dimethyl-2-butanone, bis(p -chlorobenzenesulfonyl)diazomethane, and cyclohexylsulfonyl-p-toluenesulfonyldiazomethane. Example embodiments of photoacid generators corresponding to Formula III include 1-p-toluenesulfonyl-1-cyclohexyl carbonyl diazomethane, 1-diazo-1-(p-toluenesulfonyl)-3,3-dimethylbutan-2-one, 1-diazo-1-benzenesulfonyl-3,3-dimethylbutan-2-one, and 1-diazo-1-(p -toluenesulfonyl)-3-methylbutan-2-one.

Example embodiments of onium salts useful as a photoacid generator in example embodiments of the composition may be represented by Formula IV:

Formula IV

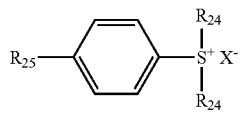

wherein, $R_{24}$ is selected from a group consisting of C1-C6 straight and branched alkyl groups, a phenyl group and substituted and unsubstituted phenylalkyl groups; $R_{25}$ is selected from a group consisting of hydrogen, halogens and C1-C4 straight, branched and cyclic alkyl groups; and further wherein X is selected from a group consisting of C1-C8 straight, branched and cyclic alkyl sulfonates and perfluoroalkyl sulfonates, naphthyl sulfonate, 10-camphor sulfonate, phenyl sulfonate, tolyl sulfonate, dichlorophenyl sulfonate, trichlorophenyl sulfonate, trifluoromethylphenyl sulfonate, chlorine, bromine, $SbF_6$, $BF_4$, $PF_6$ and $AsF_6$.

Example embodiments of groups suitable for inclusion as X in Formula IV include, for example, triphenylsulfonium trifluoromethane sulfonate, triphenylsulfonium perfluorooctane sulfonate, triphenylsulfonium perfluorobutane sulfonate, diphenyl-p-tolylsulfonium perfluorooctane sulfonate, tris(p-tolyl)sulfonium perfluorooctanesulfonate, tris(p-chlorobenzene)sulfonium trifluoromethane sulfonate, tris(p-tolyl)sulfonium trifluoromethane sulfonate, trimethylsulfonium trifluoromethane sulfonate, dimethylphenylsulfonium trifluoromethane sulfonate, dimethyltolylsulfonium trifluoromethane sulfonate, dimethyltolylsulfonium perfluorooctanesulfonate, triphenylsulfonium p-toluene sulfonate, triphenylsulfonium methane sulfonate, triphenylsulfonium butane sulfonate, triphenylsulfonium n-octanesulfonate, triphenylsulfonium 1-naphthalene sulfonate, triphenylsulfonium 2-naphthalene sulfonate, triphenylsulfonium 10-camphor sulfonate, triphenylsulfonium 2,5-dichlorobenzene sulfonate, diphenyltolylsulfonium 1,3,4-trichlorobenzene sulfonate, dimethyl tolylsulfonium p-toluenesulfonate, diphenyl tolyl sulfonium 2,5-dichlorobenzene sulfonate, triphenylsulfonium tetrafluoroborate, triphenylsulfonium hexafluoroacetate, and triphenylsulfonium chloride.

The range of solvents suitable for use in example embodiments of the composition are not particularly limited, but will include those solvents capable of dissolving a sufficient quantities of both the heteroatom-containing conjugated electroconductive polymer(s) and the photoacid generator(s) to obtain a composition having a satisfactory solids content. It is expected that suitable solvents will include, for example, ethyleneglycol monomethyl ether, ethyleneglycol monoethyl ether, methylcellosolve acetate, ethylcellosolve acetate, diethyleneglycol monomethyl ether, diethylene glycol monoethylether, propylene glycol methylether acetate, propylene glycol propylether acetate, diethylene glycol dimethylether, ethyl lactate, toluene, xylene, methylethylketone, cyclohexanone, 2-heptanone, 3-heptanone, 4-heptanone, and mixtures and combinations thereof.

In addition to a primary solvent or solvent mixture, example embodiments of the composition may also include a co-solvent selected from a group consisting of N-methylformamide, N,N-dimethylformamide, N-methylacetamide, N,N-dimethyl acetamide, N-methylpyrrolidone, dimethylsulfoxide, alcohols, and mixtures and combinations thereof. When one or more co-solvents are incorporated, example embodiments of the composition may include 5 to 25 wt % of the conjugated electroconductive polymer(s) and up to 10 wt % of the co-solvent(s) wherein the weight percentages of the polymer(s) and co-solvent(s) are based on the weight of the primary solvent(s) included in the composition.

Depending on the intended application and processes, example embodiments of the composition may also include one or more additives selected from a group including, for example, surfactants, stabilizers, coat modifiers, dyes, viscosity modifiers as necessary to provide compositions having a desired combination of properties.

Example embodiments also encompass methods of forming organic active patterns on, for example, organic memory devices using one or more example embodiments of the composition. Example embodiments of such methods include applying one or more example embodiments of the compositions directly to a substrate to form a layer and exposing portions of the layer to energy, typically UV light, to form an exposed layer. In the exposed portions of the layer, the photoacid generator(s) will be activated and react with the conjugated electroconductive polymer(s) to alter the solubility of the polymer(s) relative to the unexposed portions of the layer. The exposed layer may then be developed through exposure to a suitable solvent for removing the more soluble portions of the layer, thereby forming a pattern comprising the residual portions of the layer. Because example embodiments of the method directly expose and pattern the layer, there is no need for an additional photosensitive layer, for example, photoresist, in order to form the desired pattern, thereby tending to reduce fabrication complexity and cost.

Example embodiments of methods for forming an organic active pattern for use in an organic memory device typically include applying an example embodiment of the composition to a substrate surface and drying the composition to form a coating layer. Portions of this coating layer may then be exposed to energy, for example, UV radiation, having an appropriate wavelength and energy sufficient to activate the photoacid generator(s) within the coating layer. Typically, the coating layer will be exposed to UV light through a photomask on which a predetermined pattern is provided for reproduction on the substrate. The substrates suitable for use in example embodiments of the invention are not particularly limited and those skilled in the art will be able to identify those substrates that may be more suitable for particular applications. Substrates may include, for example, insulators, for example, glass and sapphire, semiconductors, for example, silicon and germanium, surface-modified glass, and plastics, for example, polypropylene and activated acrylamide.

The composition may be applied to the substrate using any appropriate conventional technique, including, for example, spin-coating, ink jet-printing, roll-to-roll, spraying and/or thermal deposition (e.g., using a low temperature organic evaporator). Following the coating process, most of the solvent remaining in the composition may be removed using a soft-bake process to form the organic active layer. The soft-baking process may, for example, be conducted at a soft bake temperature from 80 to 110° C. for a bake period of from 1 to 10 minutes. For many applications, it is expected that an organic active layer formed by depositing the composition on the substrate surface to a thickness of from about 50 to 3000 Å will provide acceptable results, but as will be appreciated by those skilled in the art, organic active layers thicknesses below 50 or above 3000 Å may be more suitable in some applications.

The exposure process will typically utilize a photomask on which a predetermined positive or negative pattern is provided positioned between a light source and the substrate whereby selected portions of the organic active layer can be exposed to light while adjacent portions remain unexposed. As will be appreciated by those skilled in the art, the particular combination of wavelength(s), incident energy (W/cm$^2$) and exposure time will vary depending on a number of factors well known to those skilled in the photolithographic arts. The combination of wavelength(s), energy and exposure time should, however, be sufficient to induce acid production by the photoacid generator(s) present in the organic active layer. It is anticipated that in most instances a UV source characterized by a wavelength from 150 to 400 nm, for example, 365 nm may be used successfully for those combinations of exposure time and energy intensity sufficient to provide adequate activation of the photoacid generator which, in turn, increases the aqueous solubility of adjacent polymers. In such instances, water may be used as the developing agent to remove the exposed regions of the organic active layer, thereby leaving a residual organic active pattern.

Figure 2:
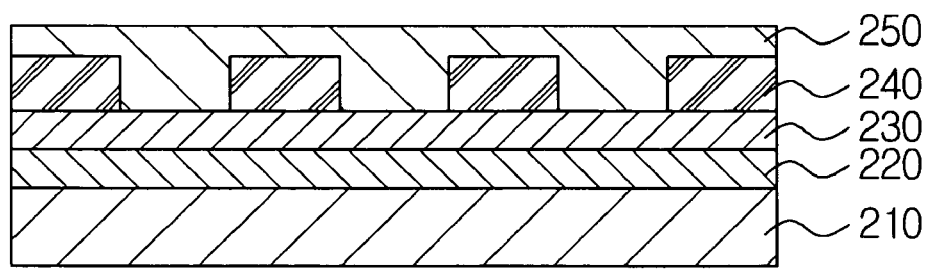
FIG. 2 is a schematic cross sectional view of an organic memory device in accordance with an example embodiment.

Example embodiments also encompass organic memory devices which comprise an organic active pattern fabricated from an example embodiment of an organic active layer that extends between two electrodes. An example embodiment of such an organic memory device is illustrated in FIG. 2 and comprises a substrate 210 on which a lower electrode 220 and an upper electrode 250 are formed, with an organic active layer 240 arranged between the two electrodes. An optional barrier layer 230 may be provided on the lower electrode 220. Example embodiments of the organic active layer 240 may typically exhibit a thickness from about 50 to 3000 Å, but as will be appreciated by those skilled in the art, organic active layers thicknesses below 50 or above 3000 Å may be more suitable in some applications.

Example embodiments of the compounds utilized in forming the organic active layer 240 are selected for their ability to exhibit bistability in resistance performance that may, in turn, be utilized in imparting memory properties to the device. Like conventional memory devices, example embodiments of the organic memory devices can be selectively forced into two distinct states, a conductive state (low impedance state) and a nonconductive state (high impedance state). By controlling the transition between the conductive state and the nonconductive state, example embodiments of memory cells may be converted into one or more additional intermediate states. The availability of one or more intermediate states permits the fabrication of organic memory devices having increased memory capacity. Unlike conventional memory devices which provide only two states, organic memory devices exhibiting three or more conduction states (e.g., high, mid, and low impedance states), additional information can be stored as multiple bits in a single memory cell.

The upper electrode 250 and the lower electrode 220 independently comprise an electroconductive material selected from a group consisting of metals, metallic alloys, metal nitrides, metal silicides, metal oxides, metal sulfides, carbon, electroconductive polymers, organic conductors, and combinations thereof. Example embodiments of the electrode materials include, for example, aluminum (Al), gold (Au), silver (Ag), platinum (Pt), copper (Cu), titanium (Ti), tungsten (W), and indium tin oxide (ITO). In those instances in which the electrodes comprise only organic materials, the resulting memory device may consist only of organic materials. As will be appreciated by those skilled in the art, depending on the electrode materials utilized, a variety of conventional formation processes, for example, deposition (e.g., thermal deposition), sputtering, e-beam evaporation and spin coating, may be employed.

Example embodiments of electroconductive polymers that are expected to be useful in forming organic active patterns include, for example, polyphenylacetylenes, such as polydiphenyl acetylene, poly(t-butyl)diphenylacetylene, poly(trifluoromethyl)diphenyl acetylene, poly(bistrifluoromethyl) acetylene, polybis(t-butyldiphenyl)acetylene, poly(trimethylsilyl)diphenyl acetylene, poly(carbazol) diphenylacetylene, polydiacetylene, polyphenylacetylene, polypyridine acetylene, polymethoxyphenyl acetylene, polymethylphenyl acetylene, poly(t-butyl)phenyl acetylene, polynitrophenyl acetylene, poly(trifluoromethyl)phenyl acetylene, poly(trimethylsilyl)phenyl acetylene, derivatives thereof, and polythiophenes.

Example embodiments of a memory device may, as illustrated in FIG. 2, include an optional barrier layer 230 formed on the lower electrode 220 in order to reduce the likelihood of damage to the lower electrode during subsequent processing. Example embodiments of barrier materials for forming the barrier layer 230 include, for example, $SiO_x$, $AlO_x$, $NbO_x$, $TiO_x$, $CrO_x$, $VO_x$, $TaO_x$, $CuO_x$, $MgO_x$, $WO_x$ and $AlNO_x$, with $SiO_2$, $Al_2O_3$, $Cu_2O$, $TiO_2$, and $V_2O_3$ expected to be useful in a range of applications. Alternatively, the barrier layer may be made from one or more organic materials including, for example, Alq3 (aluminum tris(8-hydroxyquinoline), PMMA (polymethylmethacrylate), PS (polystyrene) and PET (polyethylene terephthalate). As will be appreciated by those skilled in the art, although the target thickness of the barrier layer will be a function of various parameters including, for example, the barrier material(s) utilized, the electrode topography and the subsequent processing, it is expected that a barrier layer thickness of 20 to 300 Å will be suitable for many applications.

By utilizing the change in electrical resistance of the organic active pattern for storing information in a memory cell, example embodiments of the memory devices will be non-volatile and may, therefore, be of particular usefulness in applications including, for example, mobile terminals, smart cards, electronic money, digital cameras, gaming devices, MP3 players and other electronic devices that are used intermittently and/or for which reduced power consumption is particularly advantageous.

Figure 3A:
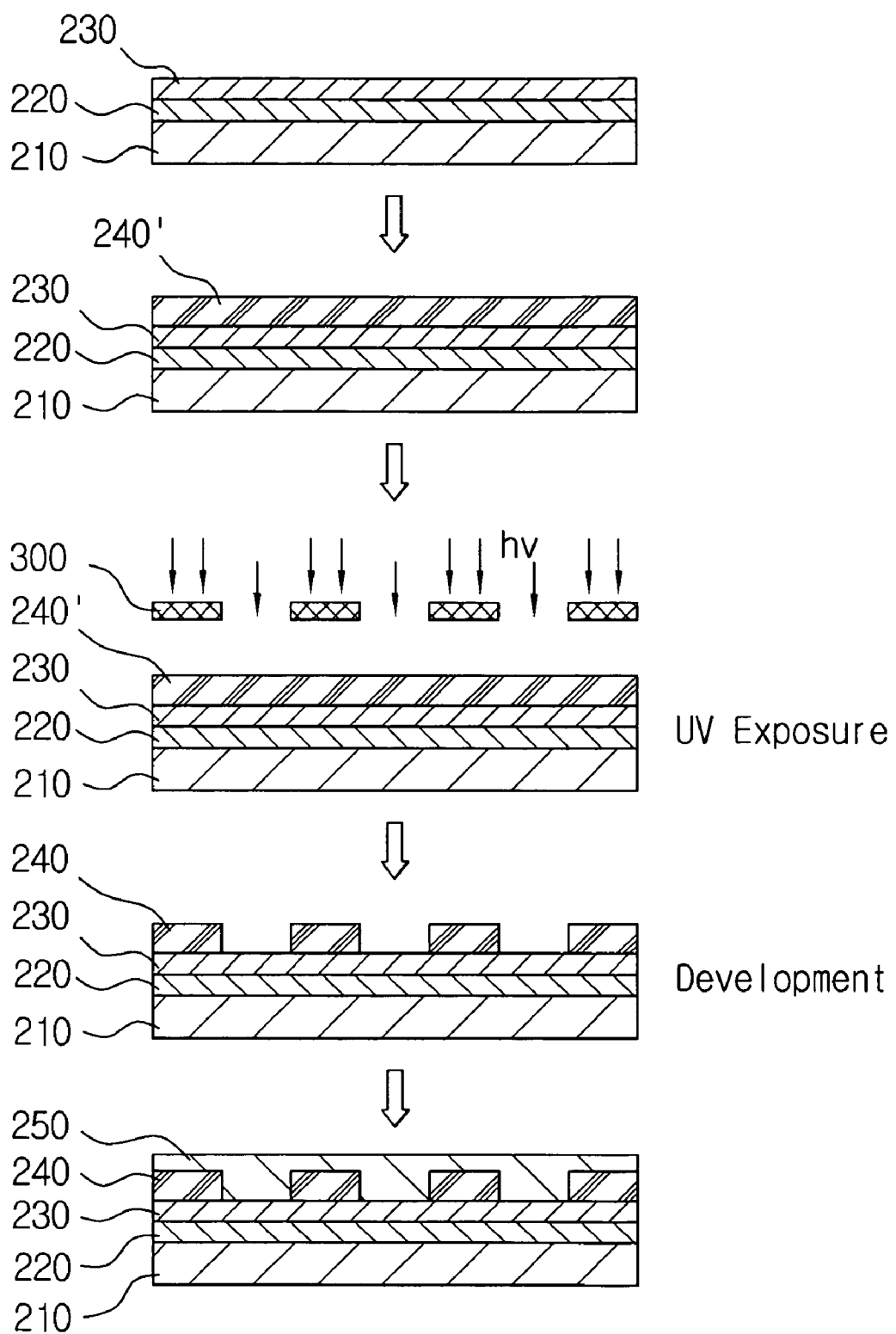
FIG. 3A is a schematic view showing the process of fabricating an organic memory device in accordance with an example embodiment.

An example embodiment of a process for fabricating an organic memory device is illustrated in FIG. 3A in which a lower electrode 220 is formed on a substrate 210 and a barrier layer 230 is formed on the lower electrode. A composition comprising a mixture of electroconductive polymer(s), photoacid generator(s) and solvent(s) is then applied to the barrier layer and dried to form an organic active layer 240'. After being aligned under an appropriate photomask 300, predetermined regions of the organic active layer 240' are exposed to UV light. The exposed organic active layer 240' is then developed using an appropriate solvent to remove the exposed regions of the exposed organic active layer, the remaining portions of the organic active layer comprising an organic active pattern 240. An upper electrode 250 is then formed on the organic active pattern, thereby providing organic memory cells comprising a region of the organic active material arranged between the lower and upper electrodes for use in, for example, organic memory devices.

Figure 3B:
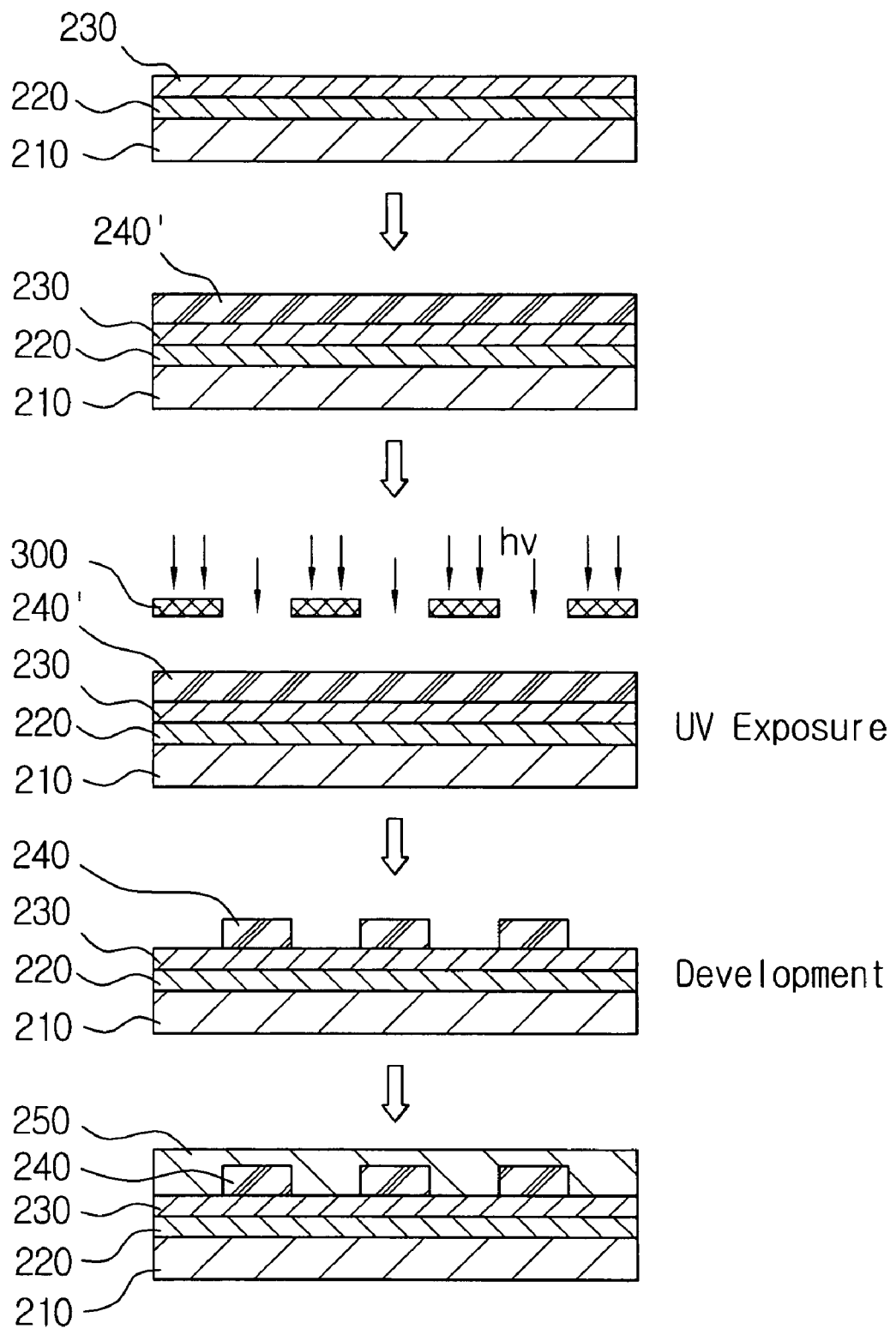
FIG. 3B is a schematic view showing the process of fabricating an organic memory device in accordance with another example embodiment.

Another example embodiment of a process for fabricating an organic memory device is illustrated in FIG. 3B in which a lower electrode 220 is formed on a substrate 210 and a barrier layer 230 is formed on the lower electrode. A composition comprising a mixture of electroconductive polymer(s), photoacid generator(s) and solvent(s) is then applied to the barrier layer and dried to form an organic active layer 240'. After being aligned under an appropriate photomask 300, predetermined regions of the organic active layer 240' are exposed to UV light. The exposed organic active layer 240' is then developed using an appropriate solvent to remove the non-exposed regions of the exposed organic active layer, the remaining portions of the organic active layer comprising an organic active pattern 240. An upper electrode 250 is then formed on the organic active pattern, thereby providing organic memory cells comprising a region of the organic active material arranged between the lower and upper electrodes for use in, for example, organic memory devices.

A more thorough understanding of example embodiments may be realized with the following example, which is set forth to illustrate an embodiment of an electroconductive polymer, a photoacid generator and a solvent composition useful for forming organic active layers and an embodiment of a method for forming such a layer and forming an organic active pattern for use in an organic memory device. This following Example, therefore, should not be construed to limit unduly the example embodiments within the scope of the disclosure.

EXAMPLE 1

A raw composition comprising (a) an electroconductive polymer corresponding to Formula V (illustrated below) and having a weight average molecular weight of about 50,000, (b) a photoacid generator corresponding to Formula VI (illustrated below) (wherein m=1 and n=1) and (c) a DMF (N,N-dimethylformamide) solvent was prepared by mixing the ingredients to form a solution. The solution was then filtered through a 0.2 μm Teflon filter to obtain a sample organic active composition.

Formula V

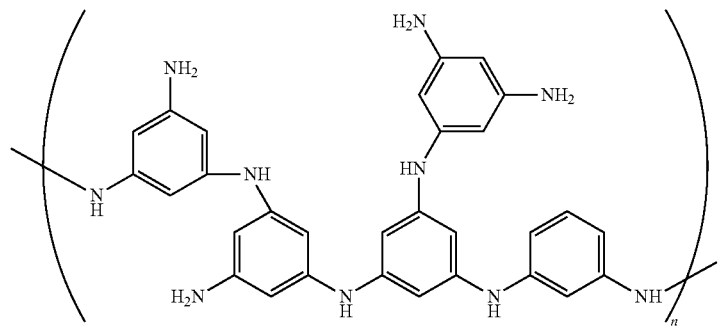

Formula VI

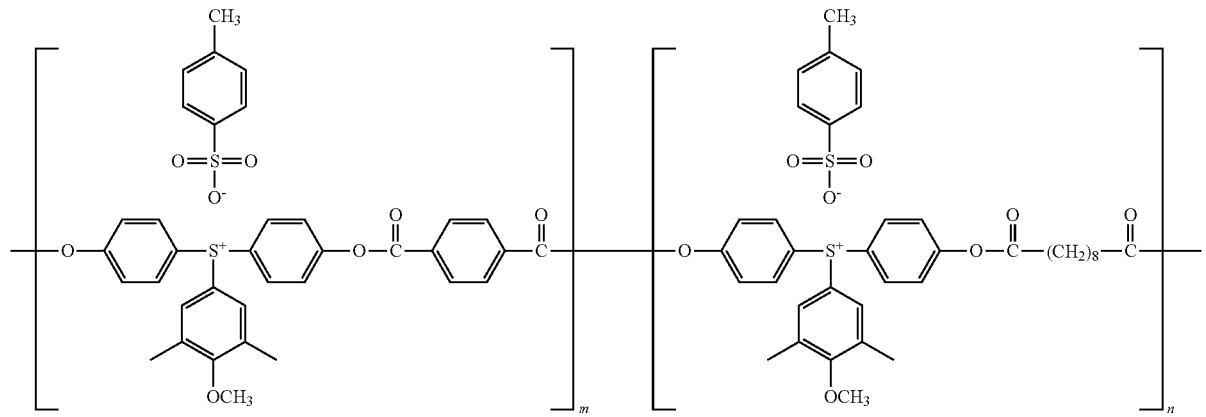

A copper layer was formed on a silicon substrate for use as a lower electrode. A 20 nm barrier layer of LiF was formed on the copper layer using a spin coating process to form a composite conductive layer on the substrate. The composite conductive layer was patterned and etched to form a lower electrode pattern. A volume of the sample organic active composition was then applied to the lower electrode pattern using a spin coating process to form an initial organic active layer which was then subjected to a soft bake at 120° C. for 20 minutes to remove the majority of the solvent and obtain an organic active layer.

The coated substrate was then immersed for 1 minute in a 1 wt % solution of $HAuCl_4$ in ethanol and then washed several times with deionized water. After the washing was completed, the coated substrate was immersed in a 1 wt % solution of $NaBH_4$ in methanol for about 15 seconds and then subjected to a second washing with deionized water. The coated substrate was then dried overnight at 60° C. under a vacuum.

A photomask was prepared by patterning and etching a chrome layer that had been applied to a quartz plate to form a chrome pattern. The photomask was aligned with the coated substrate so that the chrome pattern was adjacent the organic active layer. The organic active layer was then exposed through the photomask using UV light having a wavelength of 365 nm to form an exposed organic active layer. The exposed organic active layer was then developed by exposing the active layer to water for 30 seconds in water to form an initial pattern that was then washed with water for an additional 60 seconds to remove the exposed region of the organic film to obtain an organic active pattern.

An aluminum layer was then formed over the organic active pattern by deposited aluminum using a thermal evaporation process and then patterned and etched to form an upper electrode. The organic active layer and each of the electrodes were found to range in thickness from 15 to 100 nm and from 50 to 100 nm, respectively, as measured with an Alpha-Step™ profilometer.

Figure 4A:
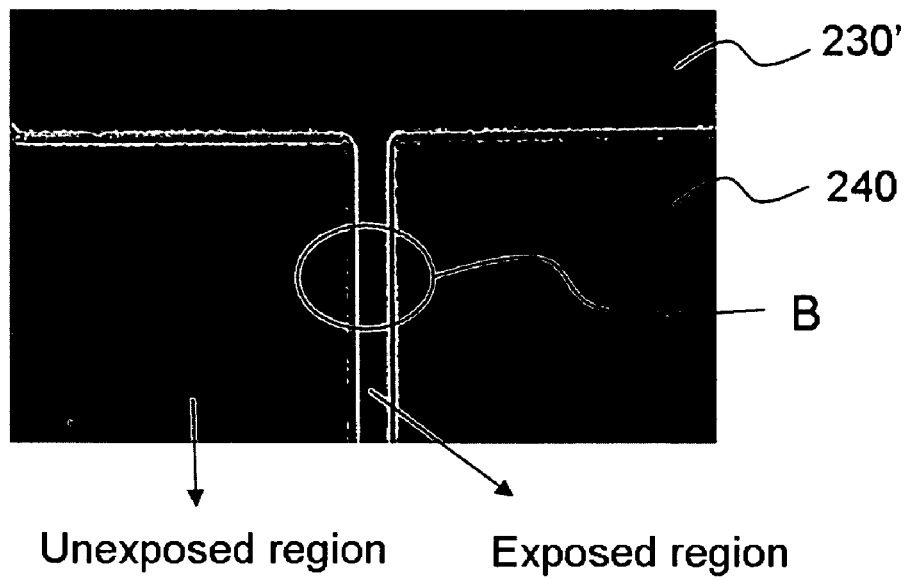
FIGS. 4A and 4B are microphotographs of an organic active pattern prepared using a composition according to Example 1 and a method according to an example embodiment.
Figure 4B:
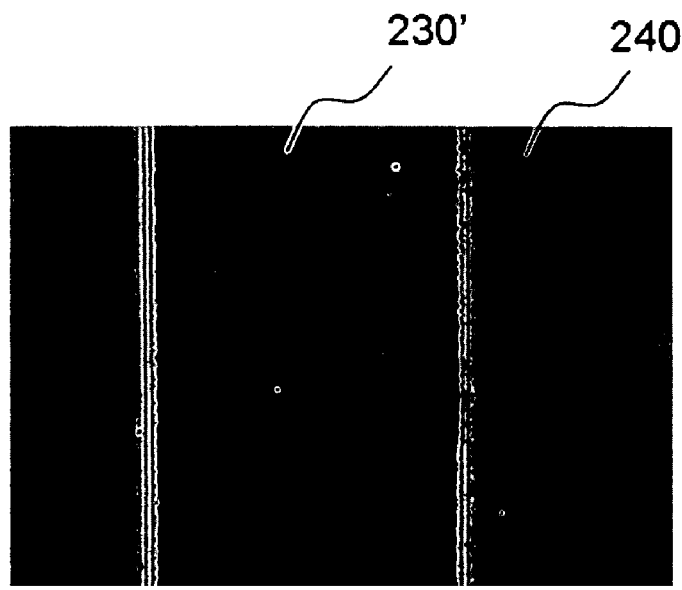

The microphotographs reproduced in FIGS. 4A and 4B illustrate the organic active pattern obtained using the compositions and method as detailed in the Example with FIG. 4B (right image) providing a magnified view of the area B indicated on FIG. 4A (left image) in which the organic active pattern 240 and surface regions of the barrier layer 230' may be observed. As reflected in FIG. 4B, the organic active pattern 240 was produced with widths as fine as 50 µm between adjacent active regions without employing an expensive, complicated process such as an additional photoresist process.

Figure 5:
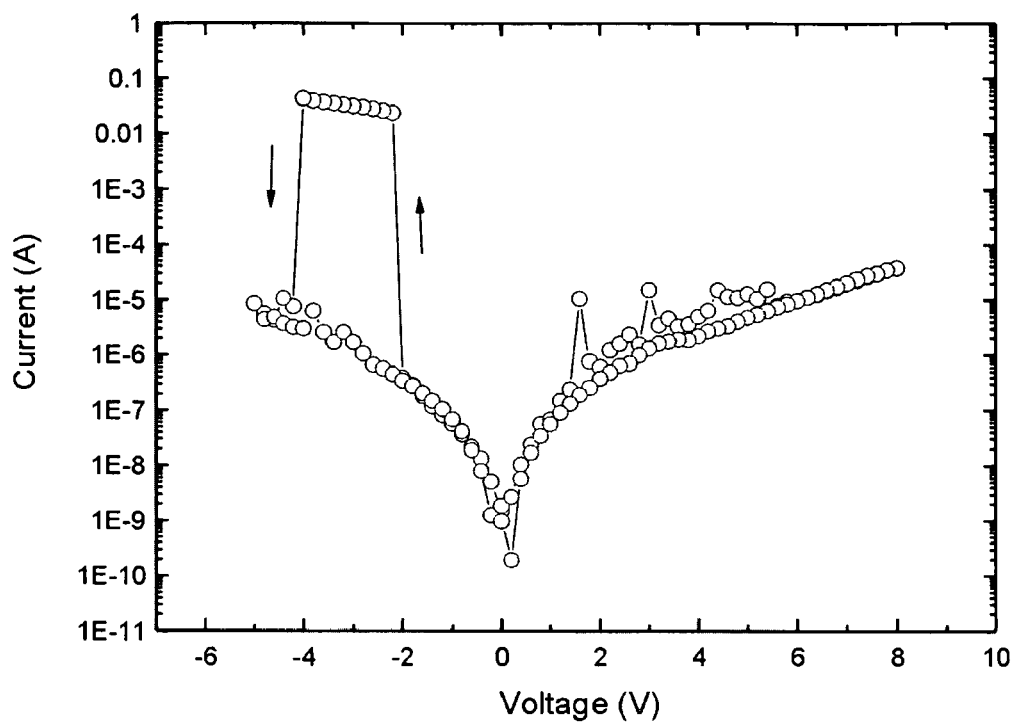
FIG. 5 is a graph in which the current of the organic memory device fabricated according to Example 1 is plotted against voltage.

FIG. 5 illustrates a current-voltage (I-V) plot obtained using an organic memory device fabricated in the manner detailed in the above Example. The voltage scan was conducted with 0.1 volts/sweep. As may be seen in FIG. 5, the current sharply increased near −4 V for the first bias sweep, indicating the formation of a set state within the organic active material, and drastically decreased at near −2.5 V, indicating the formation of a reset state. As may be seen in FIG. 5, the current differed by as large as five orders of magnitude between the set state and the reset state of the organic active material.

After the voltage was removed from the device in the set state, a second sweep allowed the device to be in a high current state even at a low voltage. The organic memory device of example embodiments exhibited electrical bistability, i.e., it is capable of exhibiting two distinct resistivity states at the same applied voltage. Because these two states of different resistivity may be read using a relatively low reading voltage, devices incorporating such structures and materials may be useful as memory devices. The bistability reflected in the data plotted in FIG. 5 generally indicates the utility of example embodiments of memory devices incorporating such organic active materials.

Figure 6:
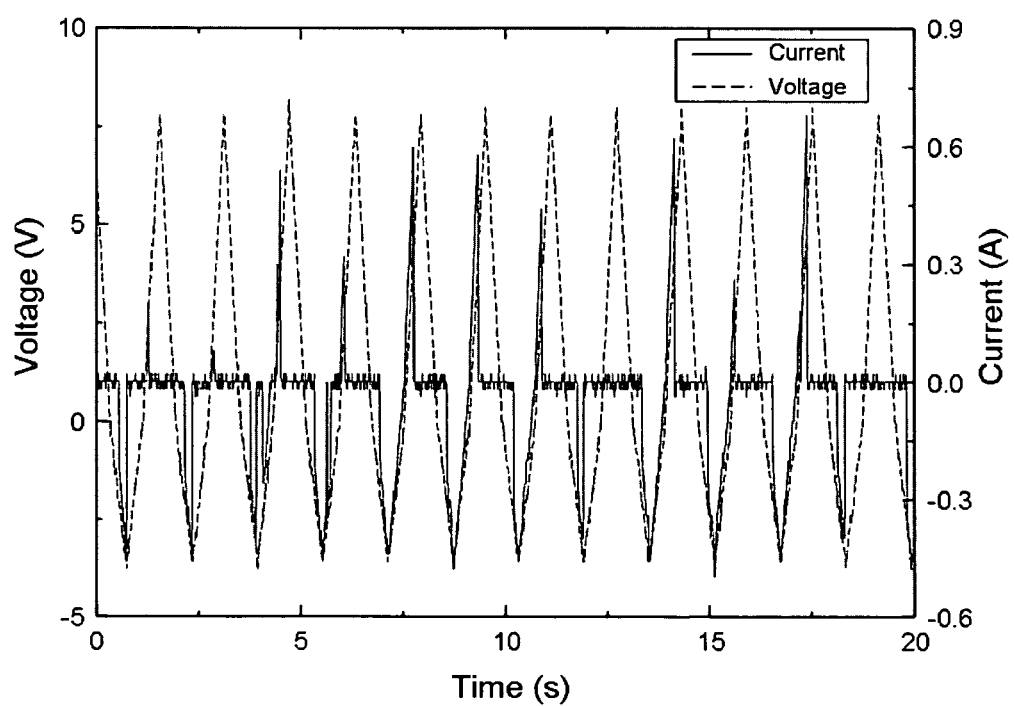
FIG. 6 is a current-voltage (I-V) curve of a memory device fabricated according to Example 1 embodiment with repeated cycling.

FIG. 6 is another current-voltage curve (I-V curve) generated from an organic memory device fabricated according to the above Example. The voltage scan illustrated in FIG. 6 was conducted with 0.1 volts/sweep with solid lines and dotted lines representing the measured currents and voltages, respectively. As reflected in the data plotted in FIG. 6, example embodiments of organic memory devices are capable of switching between the two resistivity states in a consistent and reproducible manner.

Although certain example embodiments have been disclosed for illustrative purposes, those skilled in the art will appreciate that various modifications, additions and substitutions to the compositions and methods are possible. Accordingly, insubstantial modifications, additions and substitutions should be understood as falling within the scope and spirit of the disclosure consistent with the example embodiments. For example, the compositions used forming patterns and the method of forming patterns in accordance with example embodiments are not limited to memory devices but may be applied to a range organic devices including, for example, LEDs, photoelectric conversion devices and display devices. In particular, organic memory devices incorporating one or more electroconductive polymers incorporating an amine group are expected to be useful for patterning metal filament memory devices.

EXAMPLE 2

A raw composition comprising (a) an electroconductive polymer corresponding to the above Chemical Formula (weight average molecular weight of about 50,000,), (b) a photoacid generator corresponding to of the following Chemical Formula VI (wherein m=1 and: n=1) and a DMF solvent was prepared by mixing the ingredients to form a solution. The solution was then filtered through a 0.2 µm Teflon filter to obtain a sample organic active composition.

An aluminum layer was formed on a silicon substrate for use as a lower electrode. A 20 nm barrier layer of LiF was formed on the copper layer using a spin coating process to form a composite conductive layer on the substrate. The composite conductive layer was patterned and etched to form a lower electrode pattern. A volume of the sample organic active composition was then applied to the lower electrode pattern using a spin coating process to form an initial organic active layer which was then subjected to a soft bake at 120° C. for 20 minutes to remove the majority of the solvent and obtain an organic active layer.

The coated substrate was then immersed for 1 minute in a 1 wt % solution of $HAuCl_4$ in ethanol and then washed several times with deionized water. After the washing was completed, the coated substrate was immersed in a 1 wt % solution of $NaBH_4$ in methanol for about 15 seconds and then subjected to a second washing with deionized water. The coated substrate was then dried overnight at 60° C. under a vacuum.

A photomask was prepared by patterning and etching a chrome layer that had been applied to a quartz plate to form a chrome pattern. The photomask was aligned with the coated substrate so that the chrome pattern was adjacent the organic active layer. The organic active layer was then exposed through the photomask using UV light having a wavelength of 365 nm to form an exposed organic active layer.

The exposed organic active layer was then developed by exposing the active layer to water for 30 seconds in water to form an initial pattern that was then washed with water for an additional 60 seconds to remove the non-exposed region of the organic film to obtain an organic active pattern.

A copper layer was then formed over the organic active pattern by deposited aluminum using a thermal evaporation process and then patterned and etched to form an upper electrode. The organic active layer and each of the electrodes were found to range in thickness from 15 to 100 nm and from 50 to 100 nm, respectively, as measured with a quartzcrystal monitor.

Figure 7:
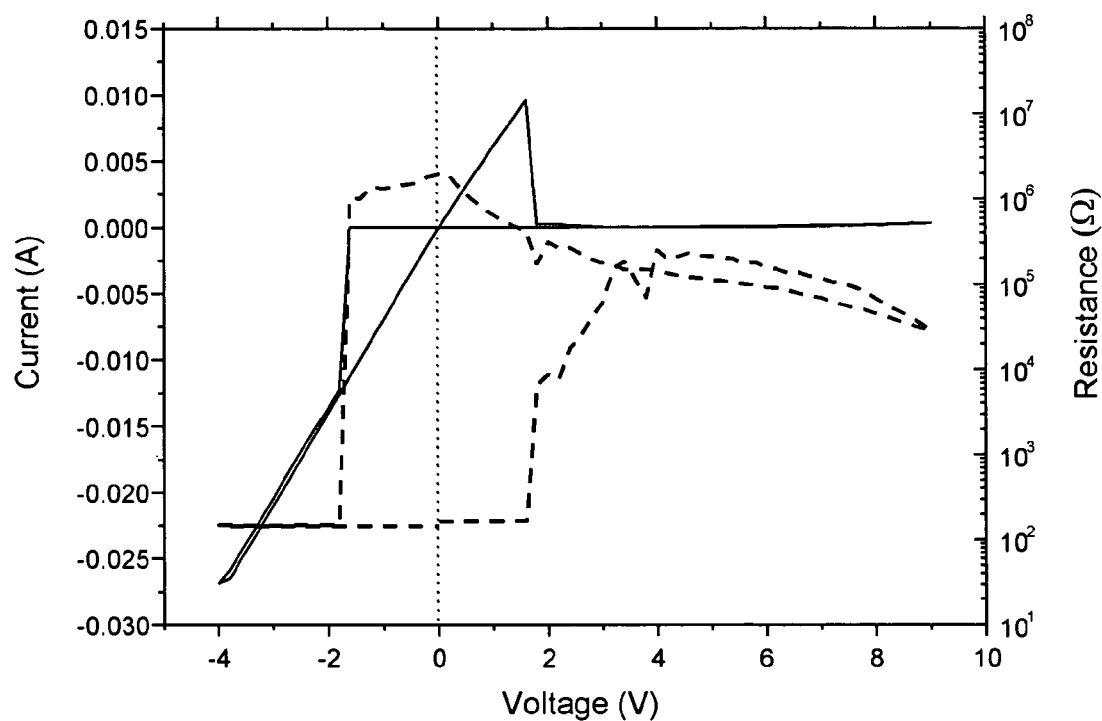
FIG. 7 is a current-voltage (I-V) curve of a memory device fabricated according to an Example 2.
Figure 8:
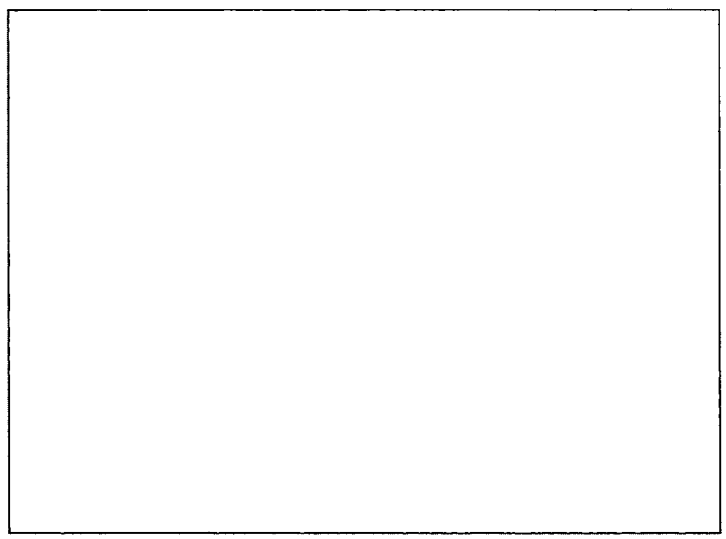
FIG. 8 is a microphotograph of an organic active pattern prepared according to an Example 2.

FIG. 7 is a current-voltage curve (I-V curve) generated from an organic memory device fabricated according to the above Example II. The voltage scan illustrated in FIG. 7 was conducted with 0.1 volts/sweep with solid lines and dotted lines representing the measured I-V (voltages and currnts) and V-R (voltages and resistances), respectively. As reflected in the data plotted in FIG. 7, example embodiments of organic memory devices are capable of switching between the two resistivity states in a consistent and reproducible manner. The microphotograph reproduced in FIG. 8 illustrates the organic active pattern obtained using the compositions and method as detailed in the Example 2. As detailed above, example embodiments of methods tend to reduce process complexity and cost by allowing fine patterns to be formed from an organic active material without using a conventional photoresist, thereby reducing or removing the need for expensive apparatus and materials. Accordingly, example embodiments of organic memory devices utilizing such materials and methods tend to reduce the fabrication cost, improve the process yield and/or improve the device yield.

What is claimed is:

1. A photosensitive composition, comprising:
a N-containing conjugated electroconductive polymer;
a photoacid generator; and
a solvent capable of dissolving both the electroconductive polymer and the photoacid generator,
wherein the electroconductive polymer includes vinylpyridine-based polymers and copolymers,
wherein the photoacid generator is a non-onium salt or an onium salt, the non-onium salt selected from the group consisting of compounds corresponding to Formula I, Formula II, Formula III, and mixtures thereof, the onium salt selected from the group consisting of compounds corresponding to Formula IV,

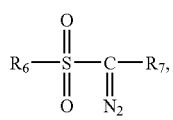

Formula I $R_6$ and $R_7$ are independently selected from the group consisting of C1-C10 straight and branched alkyl groups and C3-C10 cycloalkyl groups,

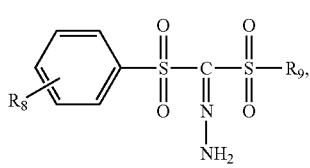

Formula II $R_8$ is selected from the group consisting of hydrogen, halogens, C1-C5 straight and branched alkyl groups, C1-C5 alkoxy groups, and C1-C5 haloalkyl groups, and
$R_9$ is selected from the group consisting of C1-C10 branched alkyl groups, C3-C10 cycloalkyl groups, C6-C10 alkylphenyl groups, and C1-C10 haloalkyl groups,

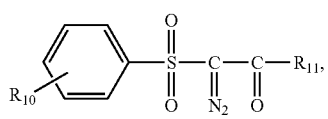

Formula III $R_{10}$ is selected from the group consisting of hydrogen, halogens, C1-C5 straight and branched alkyl groups, and a trifluoromethyl group, and
$R_{11}$ is selected from the group consisting of C1-C10 straight, branched, and cyclic alkyl groups, C6-C10 alkylphenyl groups, C1-C10 haloalkyl groups, a phenylalkyl group, C1-C5 straight and branched alkoxy groups, a phenyl group, and a tolyl group,

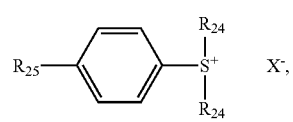

Formula IV $R_{24}$ is selected from the group consisting of C1-C6 straight and branched alkyl groups, a phenyl group, and substituted phenylalkyl groups,
$R_{25}$ is selected from the group consisting of hydrogen, halogens, C1-C4 straight, branched, and cyclic alkyl groups, and
X is selected from the group consisting of C1-C8 straight, branched, and cyclic alkyl sulfonates, C1-C8 perfluoroalkyl sulfonates, naphthyl sulfonate, 10-camphor sulfonate, phenyl sulfonate, tolyl sulfonate, dichlorophenyl sulfonate, trichlorophenyl sulfonate, trifluoromethylphenyl sulfonate, Cl, Br, $SbF_6$, $BF_4$, $PF_6$, $AsF_6$, and mixtures thereof, and
wherein the electroconductive polymer further comprises at least one of aniline-based polymers and copolymers and pyrrole-based polymers and copolymers.

2. The photosensitive composition according to claim 1, wherein:
the photoacid generator is selected from the group consisting of 1-cyclohexylsulfonyl-1-(1,1-dimethylethylsulfonyl)diazomethane, bis(cyclohexylsulfonyl)diazomethane, 1-cyclohexylsulfonyl-1-cyclohexylcarbonyldiazomethane, 1-diazo-1-cyclohexylsulfonyl-3,3'-dimethylbutan-2-one, 1-diazo-1-methylsulfonyl-4-phenylbutan-2-one, diazo-1-(1,1-dimethylethylsulfonyl)3,3-dimethyl-2-butanone, 1-acetyl-1-(1-methylethylsulfonyl)diazomethane, and mixtures thereof.

3. The photosensitive composition according to claim 1, wherein:
the photoacid generator is selected from the group consisting of bis(p-toluenesulfonyl)diazomethane, methylsulfonyl-p-toluenesulfonyldiazomethane, 1-diazo-1-(p-toluenesulfonyl)-3,3'-dimethyl-2-butanone, bis(p- chlorobenzenesulfonyl)diazomethane, cyclohexylsulfonyl-p-toluenesulfonyldiazomethane, and mixtures thereof.

4. The photosensitive composition according to claim 1, wherein:
the photoacid generator is selected from the group consisting of 1-p-toluenesulfonyl-1-cyclohexyl carbonyl diazomethane, 1-diazo-1-(p-toluenesulfonyl)-3,3-dimethylbutan-2-one, 1-diazo-1-benzenesulfonyl-3,3-dimethylbutan-2-one, 1-diazo-1-(p-toluenesulfonyl)-3-methylbutan-2-one, and mixtures thereof.

5. The photosensitive composition according to claim 1, wherein:
X is selected from the group consisting of triphenylsulfonium trifluoromethane sulfonate, triphenylsulfonium perfluorooctanesulfonate, triphenylsulfonium perfluorobutanesulfonate, diphenyl-p-tolylsulfonium perfluorooctanesulfonate, tris(p-tolyl)sulfonium perfluorooctanesulfonate, tris(p-chlorobenzene)sulfonium trifluoromethane sulfonate, tris(p-tolyl)sulfonium trifluoromethane sulfonate, trimethylsulfonium trifluoromethane sulfonate, dimethylphenylsulfonium trifluoromethane sulfonate, dimethyltolylsulfonium trifluoromethane sulfonate, dimethyltolylsulfonium perfluorooctane sulfonate, triphenylsulfonium p-toluene sulfonate, triphenylsulfonium methane sulfonate, triphenylsulfonium butane sulfonate, triphenylsulfonium n-octane sulfonate, triphenylsulfonium 1-naphthalene sulfonate, triphenylsulfonium 2-naphthalene sulfonate, triphenylsulfonium 10-camphor sulfonate, triphenylsulfonium 2,5-dichlorobenzene sulfonate, diphenyltolylsulfonium 1,3,4-trichlorobenzene sulfonate, dimethyl tolylsulfonium p-toluenesulfonate, diphenyl tolyl sulfonium 2,5-dichlorobenzene sulfonate, triphenylsulfonium tetrafluoroborate, triphenylsulfonium hexafluoroacetate, triphenylsulfonium chloride, and mixtures thereof.

6. The photosensitive composition according to claim 1, wherein:
the solvent is selected from the group consisting of ethyleneglycol monomethylether, ethyleneglycol monoethylether, N,N-dimethylformamide, methylcellosolve acetate, ethylcellosolve acetate, diethyleneglycol monomethylether, diethyleneglycol monoethylether, propyleneglycol methyl etheracetate, propyleneglycol propyl etheracetate, diethyleneglycol dimethylether, ethyl lactate, toluene, xylene, methylethylketone, cyclohexanone, 2-heptanone, 3-heptanone, 4-heptanone, and combinations thereof.

7. The photosensitive composition according to claim 1, further comprising:
a co-solvent selected from the group consisting of N-methylformamide, N,N-dimethylformamide, N-methylacetamide, N,N-dimethyl acetamide, N-methylpyrrolidone, dimethylsulfoxide, alcohols, and combinations thereof.

8. The photosensitive composition according to claim 7, wherein:
the conjugated electroconductive polymer is present in an amount from 5 to 25 wt %; and
the co-solvent is present in an amount of no more than 10 wt %, wherein the weight percentages are based on solvent weight.

* * * * *